United States Patent
Speciale et al.

(10) Patent No.: US 7,387,687 B2
(45) Date of Patent: Jun. 17, 2008

(54) SUPPORT SYSTEM FOR A TREATMENT APPARATUS

(75) Inventors: Natale Speciale, Mazara del Vallo (IT); Gianluca Valente, Milan (IT); Danilo Crippa, Novara (IT); Franco Preti, Milan (IT)

(73) Assignee: E.T.C. Epitaxial Technology Center SRL, Catania (IT)

( * ) Notice: Subject to any disclaimer, the term of this patent is extended or adjusted under 35 U.S.C. 154(b) by 0 days.

(21) Appl. No.: 10/538,547

(22) PCT Filed: Jun. 11, 2003

(86) PCT No.: PCT/IT03/00363

§ 371 (c)(1),
(2), (4) Date: Jun. 10, 2005

(87) PCT Pub. No.: WO2004/053189

PCT Pub. Date: Jun. 24, 2004

(65) Prior Publication Data

US 2006/0054091 A1  Mar. 16, 2006

(30) Foreign Application Priority Data

Dec. 10, 2002  (WO) ................ PCT/IT02/00774

(51) Int. Cl.
*C23C 16/00* (2006.01)
*H01L 16/00* (2006.01)

(52) U.S. Cl. ............................... 118/730; 156/345.55

(58) Field of Classification Search ............... 118/730; 156/345.55

See application file for complete search history.

(56) References Cited

U.S. PATENT DOCUMENTS

| 4,593,168 A | | 6/1986 | Amada |
| 4,667,076 A | | 5/1987 | Amada |
| 4,794,217 A | | 12/1988 | Quan et al. |
| 4,860,687 A | | 8/1989 | Frijlink |
| 5,106,204 A | * | 4/1992 | Dunham ................ 384/12 |
| 5,155,062 A | | 10/1992 | Coleman |
| 5,221,356 A | | 6/1993 | Hillier et al. |
| 5,226,383 A | * | 7/1993 | Bhat ................ 118/730 |

(Continued)

FOREIGN PATENT DOCUMENTS

FR  2 650 841  2/1991

(Continued)

OTHER PUBLICATIONS

Zhang, J., et al., "Growth Characteristics of SiC in a Hot-Wall CVD Reactor with Rotation", Journal of Crystal Growth 241 (2002) pp. 431-438.

(Continued)

*Primary Examiner*—Sylvia R. MacArthur
(74) *Attorney, Agent, or Firm*—Fredrikson & Byron, P.A.

(57) ABSTRACT

A system for an apparatus of the type adapted to treat substrates and/or wafers is described and comprises a stationary base element and a movable support for at least one substrate or at least one wafer, the support being rotatable above the element about a stationary axis; a chamber, and at least one duct is provided for the admission of at least one gas-flow to the chamber in order to raise the support; the system also comprises means for converting the flow of gas into the chamber into rotation of the support.

20 Claims, 6 Drawing Sheets

U.S. PATENT DOCUMENTS

| | | | |
|---|---|---|---|
| 5,695,567 | A | 12/1997 | Kordina et al. |
| 5,788,777 | A | 8/1998 | Burk, Jr. |
| 5,792,257 | A | 8/1998 | Kordina et al. |
| 6,005,226 | A * | 12/1999 | Aschner et al. ............. 219/390 |
| 6,797,069 | B2 * | 9/2004 | Paisley et al. ............... 118/730 |
| 6,811,614 | B2 | 11/2004 | Kappeler et al. |
| 7,048,802 | B2 | 5/2006 | Kaeppeler et al. |
| 2002/0090454 | A1 | 7/2002 | Paisley et al. |
| 2003/0188687 | A1 | 10/2003 | Paisley et al. |
| 2003/0233768 | A1 | 12/2003 | Kaeppeler |
| 2004/0020436 | A1 | 2/2004 | Kaeppeler et al. |
| 2004/0182310 | A1 | 9/2004 | Kaeppeler |
| 2006/0081187 | A1 | 4/2006 | Maccalli et al. |
| 2006/0118048 | A1 | 6/2006 | Maccalli et al. |
| 2006/0275104 | A1 | 12/2006 | Speciale et al. |

FOREIGN PATENT DOCUMENTS

| | | |
|---|---|---|
| GB | 1 458 222 | 12/1976 |
| WO | WO02/38838 | 5/2002 |
| WO | WO02/38839 | 5/2002 |
| WO | WO03069029 A1 | 8/2003 |
| WO | WO04053188 A1 | 6/2004 |

OTHER PUBLICATIONS

U.S. Appl. No. 10/538,529 Response filed Jan. 28, 2008 to Non Final Office Action mailed Sep. 6, 2007, 10 pgs.

U.S. Appl. No. 10/538,416 Response filed Jan. 31, 2008 to Non Final Office Action mailed Oct. 10, 2007, 9 pgs.

"PCT International Search Report dated Jan. 21, 2004 for PCT/IT02/00363, from which US Appl. No. 10/538,547 is based," 3 pgs.

"PCT Written Opinion dated Oct. 7, 2004 for PCT/IT02/00363, from which US Appl. No. 10/538,547 is based," 6 pgs.

"PCT International Preliminary Report dated Feb. 25, 2005 for PCT/IT02/00363, from which US Appl. No. 10/538,547 is based," 10 pgs.

"PCT International Search Report dated Aug. 7, 2003 for PCT/IT02/00774, from which US Appl. No. 10/538,529 is based and from which US Appl. No.10/538,547 claims priority," 4 pgs.

"PCT International Preliminary Examination Report dated Apr. 12, 2005 for PCT/IT02/00774, from which US Appl. No. 10/538,529 is based and from which US Appl. No.10/538,547 claims priority," 5 pgs.

"PCT International Search Report dated Aug. 7, 2003 for PCT/IT02/00773, from which US Appl. No. 10/538,416 is based" 4 pgs.

"PCT Written Opinion dated Jan. 18, 2005 for PCT/IT02/00773, from which US Appl. No. 10/538,416 is based," 4 pgs.

"PCT International Preliminary Examination Report dated Apr. 12, 2005 for PCT/IT02/00773, from which US Appl. No. 10/538,416 is based," 7 pgs.

"PCT International Search Report dated Mar. 8, 2005 for PCT/IT04/00335, from which US Appl. No. 10/552,937 is based," 4 pgs.

"PCT Written Opinion dated Mar. 8, 2005 for PCT/IT04/00335, from which US Appl. No. 10/552,937 is based," 5 pgs.

"PCT International Preliminary Examination Report mailed Dec. 14, 2006 for PCT/IT04/000335, from which US Appl. No. 10/552,937 is based," 6 pgs.

"U.S. Appl. No. 10/538,529 Non Final Office Action mailed Sep. 6, 2007," 14 pgs.

"U.S. Appl. No. 10/538,416 Non Final Office Action mailed Oct. 10, 2007," 9 pgs.

* cited by examiner

SUPPORT SYSTEM FOR A TREATMENT APPARATUS

CROSS-REFERENCE TO RELATED APPLICATIONS

The present application claims priority to International Application No. PCT/IT2003/000363 filed 11 Jun. 2003, which in turn claims priority to International Application No. PCT/IT2002/00774, filed 10 Dec. 2002, the teachings of all of which are incorporated herein by reference in their entirety.

The present invention relates to a support system for an apparatus of the type adapted to treat substrates and/or wafers according to the preamble to claim 1.

In order to produce integrated circuits, it is necessary to treat substrates and/or wafers; these are also used for producing simple electronic and optoelectronic components; they may be made of a single material (semiconducting or insulating) or of several materials (conducting, semiconducting, and insulating); the term "substrate" and the term "wafer" often refer in practice to the same thing, that is, a thin element which is very often disc-shaped (in solar cells, it is square); the former term is usually used when the element serves basically purely for supporting layers or structures of semiconductor material; the latter term is usually used in all other cases.

There are purely thermal treatments and chemical/physical treatments which involve heating.

In general, for the epitaxial growth of semiconductor materials (Si, Ge, SiGe, GaAs, AlN, GaN, SiC, . . . ) on substrates, high temperatures are necessary if the quality of material grown is to be suitable for electronic applications. For semiconductor materials such as silicon, temperatures typically of from 1000° C. to 1200° C. are used. For semiconductor materials such as silicon carbide, even higher temperatures are required; in particular, temperatures typically of from 1500° C. to 1800° C. are used for silicon carbide.

A reactor for the epitaxial growth of silicon carbide or similar materials therefore requires, among other things, a system which produces heat so as to be able to achieve these temperatures inside a reaction chamber; naturally, it is desirable for the system to generate heat not only effectively, but also efficiently. For these reasons, reaction chambers with hot walls are used in reactors of these types.

One of the most suitable methods of heating the walls of a reaction chamber is the method based on electromagnetic induction; an element made of conductive material, an inductor, and an alternating electrical current (having a frequency typically of between 2 kHz and 20 kHz) are provided, the electrical current is caused to flow through the inductor so as to generate a variable magnetic field, and the element is positioned so as to be immersed in the variable magnetic field; the electrical currents induced in the element because of the variable magnetic field cause heating of the element by the Joule effect; a heating element of this type is called a susceptor and can also be used directly as a wall of the reaction chamber if appropriate materials are used.

Induction heating is also very widespread in reactors with cold walls; in this case, the element that is heated by induction is the support for the substrates.

An epitaxial growth reactor also requires the reaction chamber to be thermally insulated from the outside environment, particularly to limit heat losses, and to be well sealed, on the one hand, to prevent the reaction gases from being dispersed and contaminating the outside environment and, on the other hand, to prevent the gases from the outside environment entering and contaminating the reaction environment.

In an apparatus for the treatment of substrates and/or wafers and, in particular, in epitaxial reactors, it is quite common to rotate the substrate support; this rotation is generally brought about by means of a drive apparatus which is disposed outside the treatment chamber and imparts a rotary motion to the support via appropriate transmission means. The rate of rotation of the support is always within the range of from 1 revolution/minute to 100 revolutions/minute and is generally between 6 revolutions/minute and 30 revolutions/minute.

This method of rotation functions well but has the disadvantage of requiring either transmission means which can withstand the environment of the treatment chamber or sealing means which permit the transmission of a rotary motion, or both; these requirements are even more difficult to satisfy for reactors for the growth of materials such as silicon carbide, because of the very high temperatures. To solve this problem, the use of a different rotation method based on the use of flowing gas has been considered.

An apparatus for the thermal treatment of wafers is known from U.S. Pat. No. 4,667,076; in this apparatus, the wafer is raised from its seat directly by one or more gas-flows, is kept suspended in the atmosphere of the treatment chamber directly by the gas-flows, is rotated directly by suitably directed gas-flows, and is heated by microwave radiation.

Rotating support systems for substrates which provide for a plurality (no less than three) of gas-flows for directly raising a support for disc-shaped substrates are known from U.S. Pat. No. 4,860,687; one or more gas-flows are used directly to cause the support to rotate by means of fluid-dynamic drive.

A rotating support system for substrates comprising a disc-shaped structure rotated by drive apparatus with cavities for housing four disc-shaped supports for substrates is known from U.S. Pat. No. 5,788,777; each of the disc-shaped supports is kept raised by two gas-flows and (so the patent states) rotates about its own axis as a consequence of the fact that the disc-shaped structure rotates about its axis.

The object of the present invention is to provide a rotating support system which is different from and/or better than the known systems.

This object is achieved by the support system for a treatment apparatus having the features set out in independent claim 1.

The concept upon which the present invention is based is that of using a pressure chamber that is supplied with at least one gas-flow to raise the support for substrates and/or wafers, and of converting the flow of gas into the chamber into rotation of the support.

Advantageous aspects of the present invention are set out in the dependent claims. The present invention also relates to an epitaxial growth reactor and to a thermal treatment apparatus having the features set out in independent claims 19 and 20, respectively.

The invention will become clearer from the following description which is to be considered in conjunction with the appended drawings, in which:

FIGS. 1A, 1B and 1C are schematic cross-sectional views of three variants of an embodiment of the present invention, FIGS. 2A and 2B are schematic views of rotation means according to the present invention; FIG. 2A is a vertical section and FIG. 2B is a plan view, FIGS. 3A and 3B are schematic axonometric views of a portion of the lower wall of a treatment chamber of a treatment apparatus provided with a slide with a rotatable disc, with the slide fully inserted and with the slide removed, respectively, FIG. 4 is a detailed vertical section through a portion of the wall of FIG. 3 with the slide fully inserted, and FIG. 5 is a detailed plan view of a portion of the slide of FIG. 3, without the disc.

The support system according to the present invention is specifically adapted for use in an apparatus for the treatment of substrates and/or wafers; it comprises a stationary base element and a movable support for at least one substrate or at least one wafer, the support being rotatable, above the element, about a stationary axis; a chamber is provided, defined between the element and the support, and at least one duct is provided for the admission of at least one gas-flow to the chamber in order to raise the support; the system also comprises means for converting the flow of gas into the chamber into rotation of the support.

The flow of gas into the chamber (resulting from the one or more gas-flows) causes an increase in the pressure in the chamber and hence a slight raising of the support.

The number of ducts, and the number of flows may vary according to the embodiment; it should be borne in mind that a single duct can provide many gas-flows (possibly even differing from one another in terms of flow-rate) for example, if the duct is branched and multiple outlets are provided.

Figure 1A:
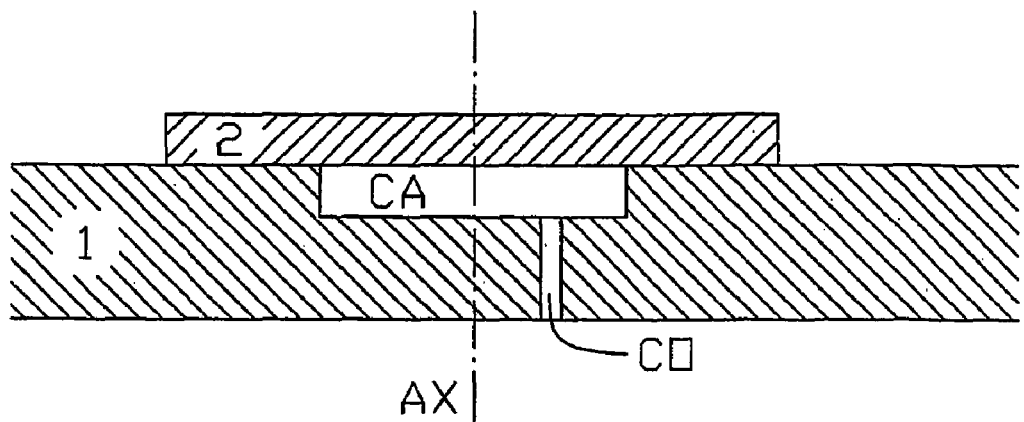
Figure 1B:
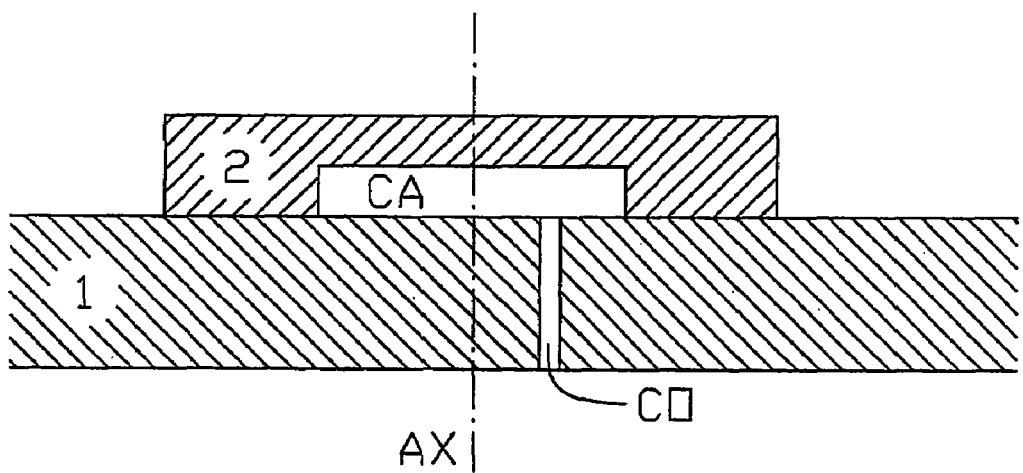
Figure 1C:
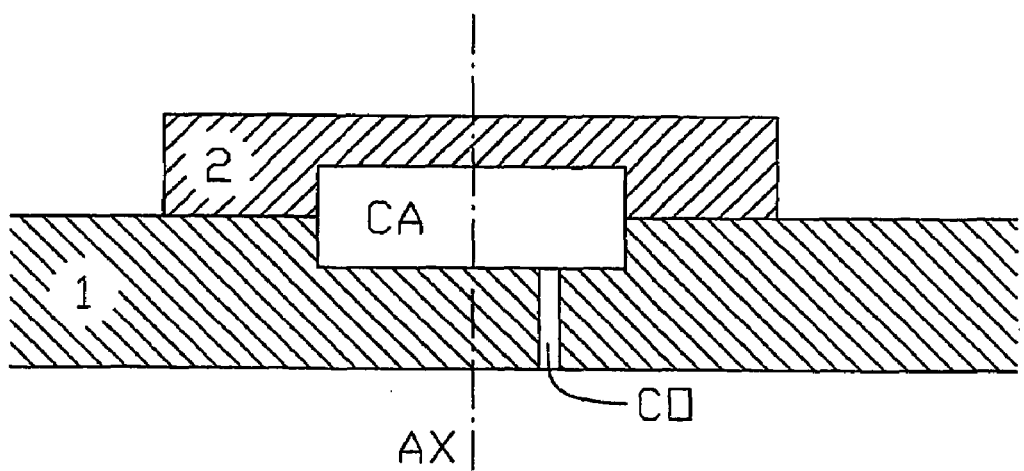

The chamber defined between the support and the base element may be formed entirely in the base element, as shown in FIG. 1A, entirely in the support, as shown in FIG. 1B, or partly in the base element and partly in the support, as shown in FIG. 1C; it should be noted that although, in the examples of FIGS. 1A; 1B, and 1C, all of the surfaces of the base element and of the support are substantially flat (for simplicity of construction), the present invention is not generally limited in this sense.

Figure 2B:
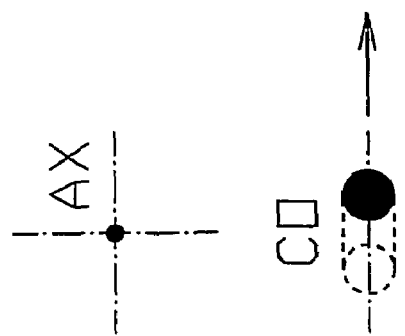
Figure 2A:
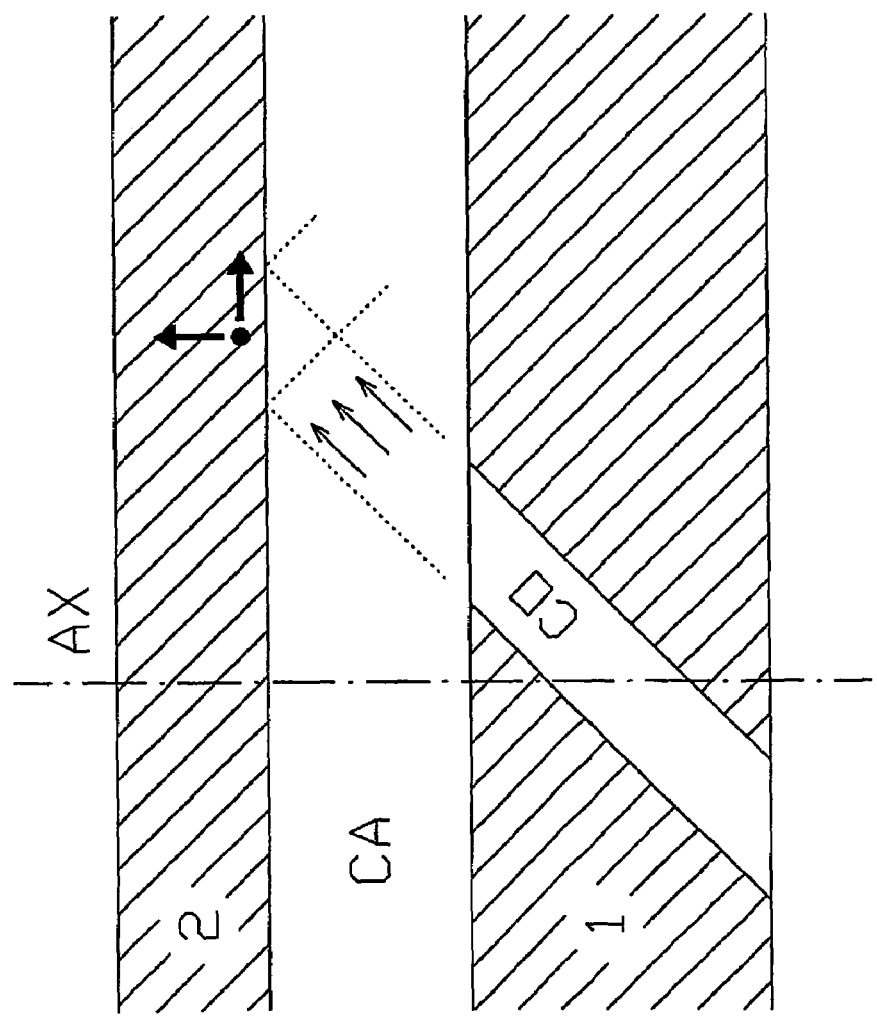

In FIG. 1 and in FIG. 2, the stationary base element is indicated 1, the movable support is indicated 2, the stationary axis of rotation of the support is indicated AX, the chamber is indicated CA, and the duct is indicated CO.

The means for converting the flow of gas into the chamber into rotation of the support are not shown in FIG. 1.

The system adopts two different configurations: one when there is no flow of gas into the chamber and the support is stationary and leaned (at least partially) on the base element and one when there is a flow of gas into the chamber, the support is in motion, that is rotating, and the support is slightly raised from the base element. It is advantageous to design the base element and the support (but also the gas inlet or inlets) in a manner such that the chamber is substantially closed in both configurations. This favours the stability of the system and prevents vibrations of the support.

The means for converting the flow of gas into the chamber into rotation of the support may be formed, according to the present invention, basically in three different ways; it should be noted that the three embodiments are not mutually exclusive and may therefore be combined to achieve greater efficacy.

According to a first embodiment, the conversion means comprise at least one duct outlet for a gas flow; the outlet opens into the chamber and is configured in a manner such that the emerging gas-flow is skew relative to the axis of rotation of the support. The gas-flow thus strikes the surface of the support that delimits the chamber, and transmits to the support a small tangential force (as well as a small vertical force); since the support is kept slightly raised from the base element because of the pressure in the chamber, even a small tangential force is sufficient to cause it to rotate. This can easily be understood with reference to FIG. 2.

To improve the stability of the rotary motion of the support and to prevent vibrations, the number of gas-outlets may be increased to two, three, four, five, six, . . .

An optimal result is achieved by providing only two duct outlets for two gas-flows; if two identical gas-flows are used, it is preferable for the outlets to open into the chamber in symmetrical positions with respect to the axis of rotation of the support and to be configured in a manner such that the two emerging gas-flows are skew and symmetrical with respect to the axis of rotation of the support; the system is thus well balanced; the two gas-flows may come from two outlets of the same duct or from two outlets of two different ducts.

According to the first embodiment, the surface of the support which delimits the chamber may be perfectly flat and perpendicular to the axis of rotation of the support.

According to the first embodiment, the angle of inclination of the gas-flows is preferably within the range of from about 30° to about 60°; an optimal selection corresponds to an angle of about 45°; angles that are too large reduce the force which the flow transmits to the support and could also create jerky periodic movements of the support; angles that are too small create gas currents in the chamber.

According to a second embodiment, the conversion means comprise at least one duct outlet for a gas-flow; the outlet opens into the chamber and is configured in a manner such that the emerging gas-flow is substantially parallel to the axis of rotation of the support. In this case, in order for the gas-flow which strikes the surface of the support that delimits the chamber to transmit a tangential force to the support, it is necessary for that surface to be suitably shaped (for example, with a circular saw-toothed profile), otherwise the gas-flow would merely contribute to the flow of gas into the chamber and hence to the pressure in the chamber.

To improve the stability of the rotary motion of the support and to prevent vibrations, the number of gas-outlets may be increased to two, three, four, five, six, . . .

An optimal result is obtained by providing only two duct outlets for two gas flows; if two identical gas-flows are used, it is preferable for the outlets to open into the chamber in symmetrical positions with respect to the axis of rotation of the support and to be configured in a manner such that the two emerging gas-flows are substantially parallel to the axis of rotation of the support; the system is thus well balanced; the two gas-flows may come from two outlets of the same duct or from two outlets of two different ducts.

According to a third embodiment, the conversion means comprise at least one channel which is defined between the element and the support and is in communication which the chamber, and which is of a shape and size such that the gas that is present in the chamber as a result of the inward gas-flow flows through the channel as a result of the pressure in the chamber and causes the support to rotate as a result of the fluid-dynamic drive.

To improve the stability of the rotary motion of the support and to prevent vibrations, the number of channels may be increased to two, three, four, five, six, seven, eight, . . . channels; it is thus advantageous to provide a plurality of channels.

The channels are very effective in causing the support to rotate, in terms of both the acceleration and the speed which can be achieved; moreover, the channels are a great aid to the stability of the rotary motion of the support, since their action can extend to the edges of the support.

Even better results are obtained with channels having depths which reduce along their extent; the fluid-dynamic drive is in fact thus considerably increased by the effect of the shallower portions of the channels.

A simple and effective selection consists in providing a substantially cylindrical chamber and substantially straight channels tangential, to the profile of the chamber; the channels may advantageously be of variable depth.

Figure 4:
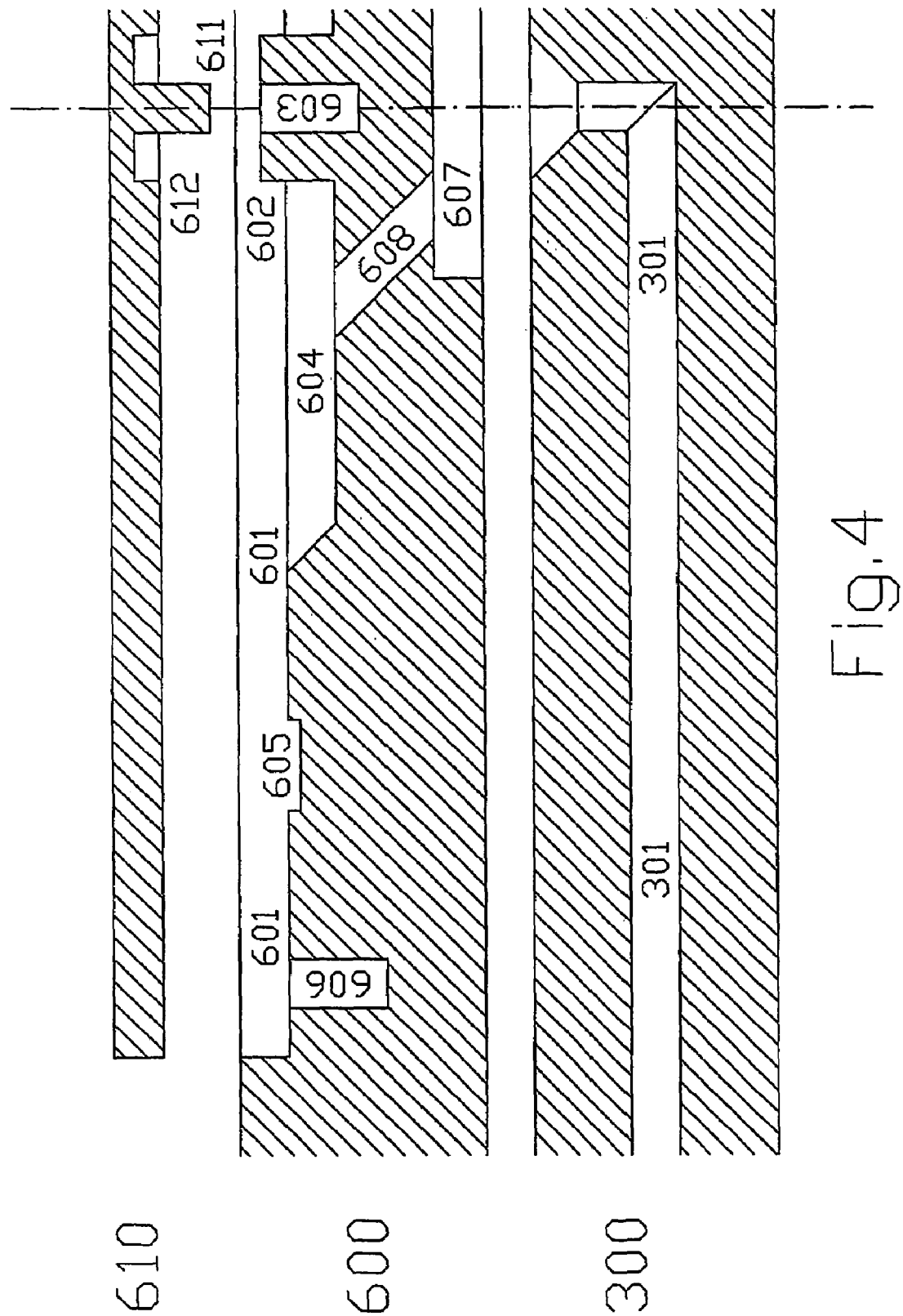

For simplicity, the chamber may be formed entirely in the element (as in FIG. 4).

Again for simplicity, the channels may be formed entirely in the base element (as in FIG. 4).

According to a preferred embodiment of the system according to the present invention, the base element has a circular recess for housing the support rotatably, the chamber is formed in the element in a central zone of the recess, and the channels are formed in the element in a peripheral zone of the recess (as in FIG. 4). The support thus always remains inserted in the recess (at least partially) both when it is stationary and when it is rotating and therefore, on the one hand, is restrained to a greater extent in the base element, and on the other hand, is less exposed to the environment of the treatment chamber.

It is preferable and advantageous to provide a pin/hole pair on the element/support pair (as in FIG. 4) for the mechanical restraint of the rotation of the support on the base element; the pin is preferably on the support and the hole (blind) is preferably in the base element (as in FIG. 4).

The rotation of the support above the base element may also take place in the absence of a pin/hole pair.

If the support is housed in a recess of the base element, the support is restrained mechanically in the element; the gas which emerges from the chamber can then surround the edges of the support and provide a pneumatic self-centring effect.

A system such as that described functions better the more symmetrical it is (from all points of view) with respect to the axis of rotation of the support.

The base element of the system according to the present invention may be adapted to constitute a slide of a treatment chamber of a treatment apparatus.

The support of the system according to the present invention may also be adapted to act as a susceptor; in fact, if it is made of electrically-conductive material (for example, graphite) it can be heated by induction and if it is made of thermally-conductive material (for example, graphite) it can be heated by radiation, for example, from the base element and/or from the walls of the treatment chamber.

A support system for substrates such as that described can advantageously be used in a reactor for the epitaxial growth of semiconductor materials on substrates.

A support system for wafers such as that described can advantageously be used in an apparatus for the thermal treatment of wafers at high temperature.

An embodiment of the present invention is described below with the aid of FIGS. 3, 4 and 5.

Figure 3B:
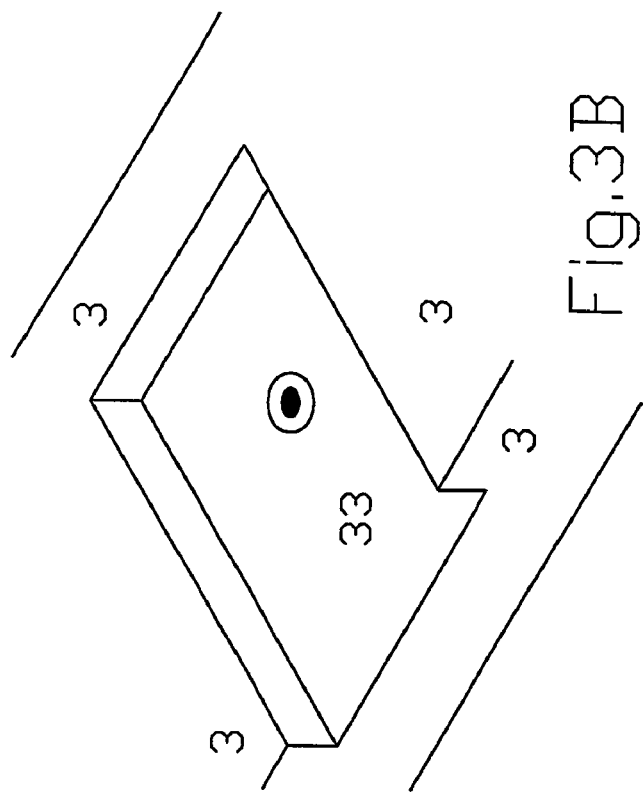
Figure 3A:
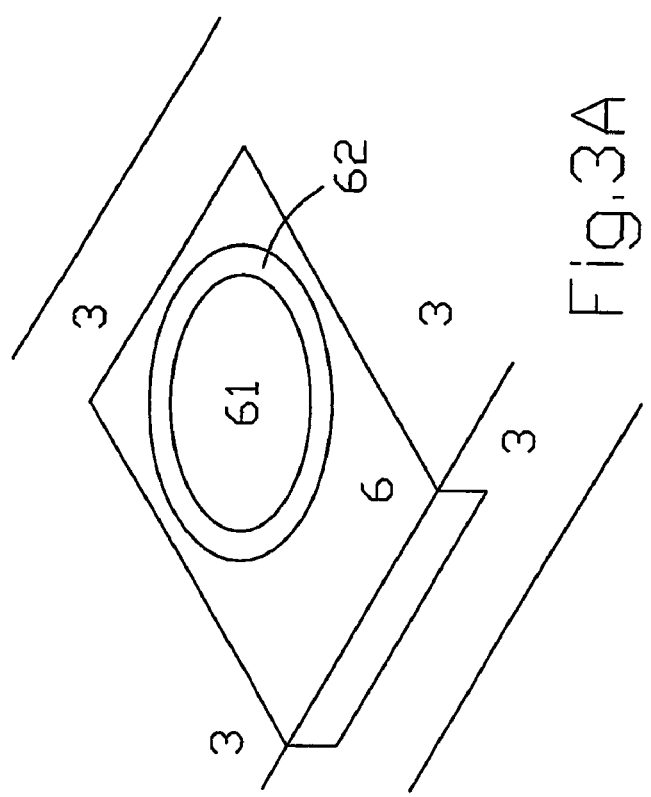

FIG. 3 shows, in a schematic, axonometric view, a portion of the lower wall of a treatment chamber of a treatment apparatus, provided with a slide with a rotatable disc.

The wall 3 of FIG. 3 comprises a slide 6, which is thus mounted inside the treatment chamber of a treatment apparatus and can support at least one substrate or at least one wafer; the slide 6 is slidable longitudinally in guided manner; operations to insert and remove substrates or wafers are thus facilitated; in fact the substrates or wafers are manipulated outside the treatment chamber and are inserted and removed by operation of the slide.

In practice, it is convenient to arrange for the wall 3 to have a guide 33 adapted to receive the slide 6 and extending longitudinally in a manner such that the slide can slide along the guide. In the embodiment of FIG. 3, the guide is formed entirely within the wall 3 and the slide 6 has a flat upper surface substantially aligned with the flat upper surface of the wall; the effective cross-section of the treatment chamber is thus substantially rectangular and regular (as if the slide were not provided).

In order to achieve more uniform treatment of the substrates or wafers, the slide 6 houses at least one disc 61 adapted to support at least one substrate or at least one wafer and has a circular recess 62 adapted to house the disc 61 for rotation.

With regard to the materials of the disc and of the slide, the embodiment of FIG. 3 is made as described below.

The slide 6 is made of graphite covered with a layer of tantalum carbide; with induction heating, the slide 6 can thus also act as an active susceptor since it is an electrical conductor; moreover, any currents induced in the wall 3 can also flow through the slide 6 since the layer of tantalum carbide is an electrical conductor and does not therefore insulate the slide 6 electrically from the wall 3.

The disc 61 is made of graphite covered with a layer of tantalum carbide; with induction heating, the disc 61 can thus also act as an active susceptor since it is an electrical conductor; any currents induced in the wall 3 and in the slide 6 cannot, however, flow through the disc 61 since, when the disc 61 rotates, it is kept slightly raised from the slide 6 (whilst remaining substantially within its recess 62) by means of a gas-flow, as will be explained further below.

The disc 61 has a weight of about 300 g (alternative embodiments may provide for different weights, for example, within the range of from 200 g to 400 g) and can support wafers/substrates having weights typically of 10 g; it can therefore be said that the weight of the support element is about ten times the weight of the elements supported.

The method of rotation of the disc 61 is based on the use of a gas-flow.

In the embodiment of FIG. 3, this method based on gas-flow enables the connection and the disconnection of the drive means (that is, of the gas-flow) to be performed easily when the slide is inserted and removed.

The solution adopted is described below with the aid of FIGS. 4 and 5, with non-limiting reference to an epitaxial reactor; reference 3 in FIG. 3 corresponds to reference 300 in FIGS. 4 and 5, reference 6 in FIG. 3 corresponds to reference 600 in FIGS. 4 and 5, and reference 61 in FIG. 3 corresponds to reference 610 in FIGS. 4 and 5.

A support 610 for a predetermined number (for example, one, three, four, five, . . . ) of substrates is provided; the support 610 has substantially the shape of a thin disc and has, on its upper side, recesses (not shown in the drawings) for housing the substrates and, on its lower side, a central cylindrical pin 611 which projects from a small cylindrical recess 612; the pin 611 serves to hold the support 610 in position and to guide its rotation; moreover the two faces of the support 610 are flat.

A slide 600 is also provided for housing the support 610; the slide 600 has substantially the shape of a thick rectangular plate; on its upper side, the slide 600 has a large cylindrical recess 601 for the complete insertion of the support 610, from which recess a central cylinder 602 projects, with a blind hole 603 for the complete insertion of the pin 611 of the support 610; in the base of the large recess 601, there is a first shallow, centred, cylindrical recess 604 with a diameter which is much smaller, for example, by half; in the base of the large recess

601, there is a predetermined number of very shallow, straight channels 605 (in FIG. 5 there are four channels, but there could also be one, two, three, or five, six, seven, eight . . . channels) which start from the first shallow recess 604 and extend tangentially therefrom; also in the base of the large recess 601, in the vicinity of its periphery, there is a deep circular groove 606; an outlet duct (not shown in the drawings) which extends from the groove 606 is also provided in the slide 600; on its lower side, the slide 600 has a second shallow cylindrical recess 607 which is centred relative to the first shallow recess 604 and is in communication therewith by means of a predetermined number (in FIG. 5 there are two but there could also be one, or three, four, . . . ) of short, oblique, cylindrical, ducts 608 (which alternatively, could be skew or vertical).

The channels 605 have a depth which reduces gradually; they have a maximum depth in the vicinity of the edges of the recess 604 and a minimum depth in the vicinity of the groove 606.

Finally, a wall 300 of the treatment chamber has a guide (not shown in the drawings) for housing the slide 600; the slide 600 can slide along the guide but remains stationary during epitaxial growth processes; the wall 300 also has a long duct 301 which opens in the base of the guide in a vertical direction in the region of the second shallow recess 607 of the slide 600 (in FIG. 4, the duct 301 opens in a centred position but it could also open in a non-central position relative to the axis of symmetry of the support 610).

The method used is summarized in the following paragraph.

A gas-flow is caused to enter the wall duct 301 which opens in the base of the slide guide; the gas-flow enters the recess 607 of the slide, passes into the recess 604 of the slide through the ducts 608 of the slide, and creates, in the recess 604 of the slide, a pressure which raises the support 610 slightly; the gas under pressure in the recess 604 of the slide is pushed into the channels 605 of the slide and is collected in the groove 606 of the slide; the flow of gas along the channels 605 of the slide brings about rotation of the slightly raised support 610 by friction (more correctly by fluid-dynamic drive).

Figure 5:
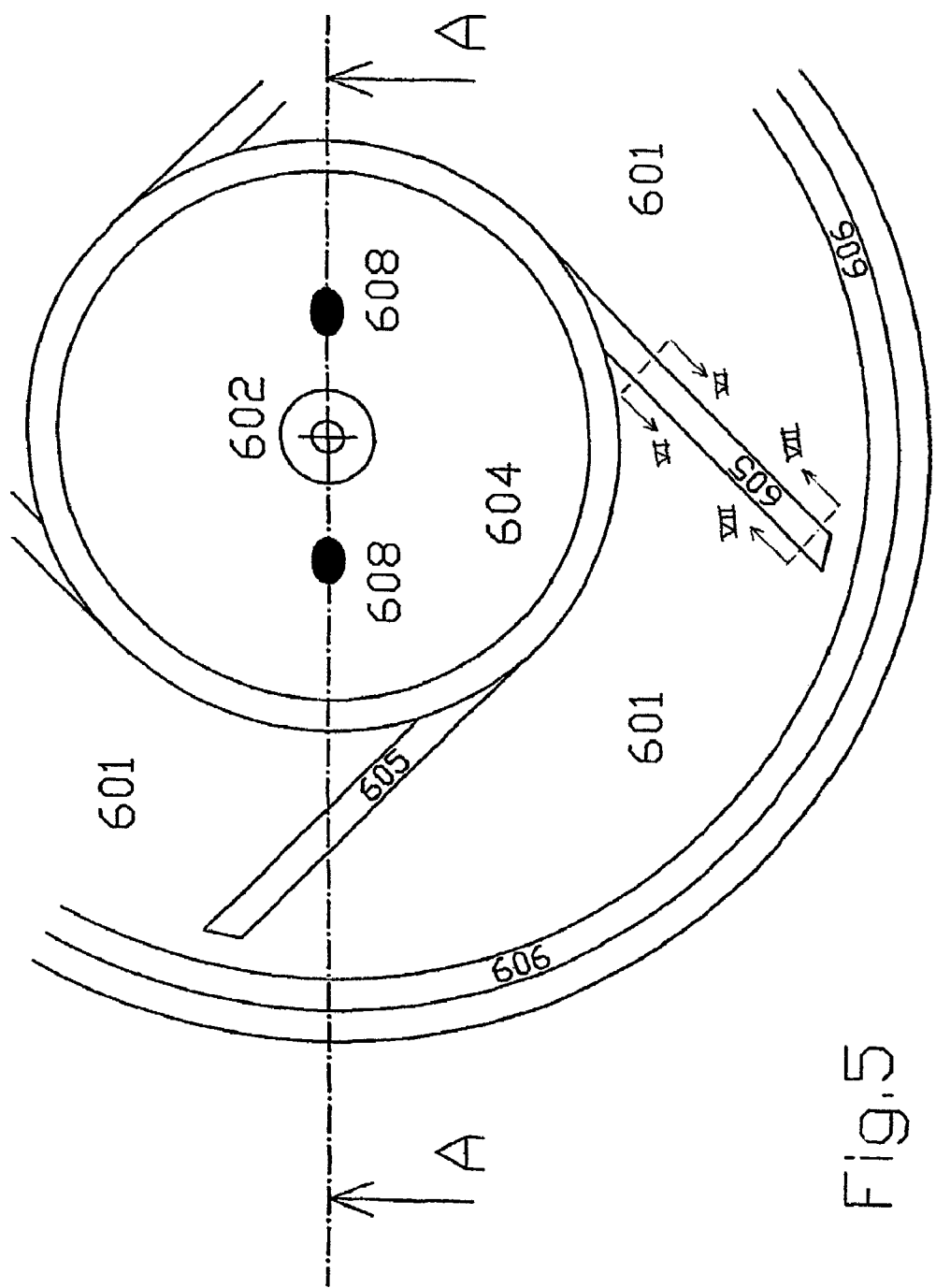
Figure 7:
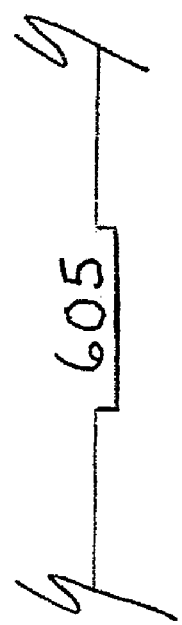
FIG. 7 is a further cross-sectional view of a channel of the slide of FIG. 5, taken along the lines VII-VII in accordance with certain embodiments of the invention.
Figure 6:
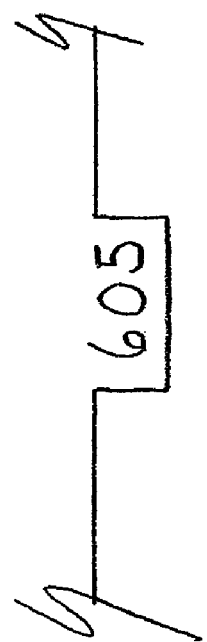
FIG. 6 is a cross-sectional view of a channel of the slide of FIG. 5, taken along the lines VI-VI in accordance with certain embodiments of the invention.

Some dimensions and some values of the system of FIGS. 3, 4 and 5 are provided by way of indication.

The diameter of the recess 601 is 200 mm, the diameter of the disc 610 is about 2 mm less, and their thickness is 5 mm; the thickness of the slide 600 is 10 mm, the diameter of the recess 604 is about 100 mm, and its thickness is 1 mm; the length of the channels 605 is from 60 mm to 70 mm and their depth is from 1 mm to 0 mm, the width of the channels is about 5 mm, the diameter of the ducts 608 is 5 mm, and the diameter of the pin 611 is 5 mm.

By following the teachings of the present invention, rotations of from 5 rpm to 40 rpm (revolutions per minute are obtained with gas-flows of from 1 slm to 2.5 slm (standard litres per minute).

A rotary support system according to the present invention can also function if the axis of rotation of the support is not perfectly vertical and, for example, is inclined by up to 5°; by taking appropriate measures, it would be possible to increase the inclination limit up to 10°-15°.

A support system according to the present invention is perfectly capable of operating without any difficulty at any temperature (in particular between 1000° C. and 1800° C. but also at higher temperatures) and in any treatment-chamber environment; naturally it will be necessary to select appropriate materials both for the base element and for the support; for epitaxial reactors, these may be made of graphite covered with silicon carbide [SiC] or of tantalum carbide [Tac].

For completeness, it is worth noting that the physical principles on which the present invention is based are: the Bernoulli principle (general aerodynamic lift equation), Newton's law on fluids, and the Navier Stokes equation.

The invention claimed is:

1. A system for an apparatus of the type adapted to treat substrates and/or wafers, the system comprising a stationary base element and a movable support for at least one substrate or at least one wafer, the support being rotatable above the element about a stationary axis, the element including a chamber being provided between the element and the support, and at least one duct being provided for the admission of at least one gas-flow to the chamber in order to raise the support, the system comprising means for converting the flow of gas into the chamber into rotation of the support, said means comprising a plurality of channels each of which is defined between the element and the support and is in communication with the chamber, and each of said channels has a shape and size such that the gas that is present in the chamber, as a result of inward flow of the gas, flows through the channels as a result of pressure in the chamber and causes the support to rotate as a result of fluid-dynamic drive characterized in that each of said channels has a depth that gradually reduces along its extent in a direction away from the said chamber.

2. A system according to claim 1, in which the chamber is substantially closed both when the support is stationary and when the support is in motion.

3. A system according to claim 1, in which said means comprise at least one duct outlet for a gas-flow, in which said outlet opens into the chamber and is configured in a manner such that the emerging gas-flow is skew relative to the axis of rotation of the support.

4. A system according to claim 3, in which said means comprise two duct outlets for two gas-flows, in which said outlets open into the chamber in positions that are preferably symmetrical with respect to the axis of rotation of the support and are configured in a manner such that the two emerging gas-flows are skew and preferably symmetrical with respect to the axis of rotation of the support.

5. A system according to claim 1, in which said means comprise at least one duct outlet for a gas-flow, in which said outlet opens into the chamber and is configured in a manner such that the emerging gas-flow is substantially parallel to the axis of rotation of the support.

6. A system according to claim 5, in which said means comprise two duct outlets for two gas-flows, in which said outlets open into the chamber in positions that are preferably symmetrical with respect to the axis of rotation of the support and the outlets are configured in a manner such that the two emerging gas-flows are substantially parallel to the axis of rotation of the support.

7. A system according to claim 5, in which the surface of the support which delimits the chamber is shaped in a manner such that a gas-flow parallel to the axis of rotation of the support transmits a tangential force to the support.

8. A system according to claim 1, in which the chamber has a substantially cylindrical shape and the channels are substantially straight and tangential to the profile of the chamber.

9. A system according to claim 1, in which the chamber is formed entirely in the element.

10. A system according to claim 9, in which the element has a circular recess adapted to house the support rotatably, in which the chamber is formed in the element in a central zone of the recess, and in which the channels are formed in the element in a peripheral zone of the recess.

11. A system according to claim 1, in which the channels are formed entirely in the element.

12. A system according to claim 11, wherein each of the channels has a maximum depth and a minimum depth, wherein the maximum depth of at least one of the channels is more centrally located in the element than the minimum depth of the at least one channel.

13. A system according to claim 12, wherein the maximum depths of the channels are more centrally located in the element than the minimum depths of the channels.

14. A system according to claim 1, in which a pin/hole pair is provided on the element/support pair, for the mechanical restraint of the rotation of the support above the element.

15. A system according to claim 1, characterized in that it is substantially symmetrical with respect to the axis of rotation of the support.

16. A system according to claim 1, in which the element is adapted to constitute a slide of a treatment chamber of a treatment apparatus.

17. A system according to claim 1, in which the support is adapted to also act as a susceptor.

18. A reactor for the epitaxial growth of semiconductor materials on substrates, characterized in that it comprises a support system for substrates according to claim 1.

19. An apparatus for the thermal treatment of wafers at high temperature, characterized in that it comprises a support system for wafers according to claim 1.

20. A system for an apparatus of the type adapted to treat substrates and/or wafers, the system comprising a stationary base element and a movable support for at least one substrate or at least one wafer, the support being rotatable above the element about a stationary axis, the element including a chamber being provided between the element and the support, and at least one duct being provided for the admission of at least one gas-flow to the chamber in order to raise the support, the system comprising means for converting the flow of gas into the chamber into rotation of the support, said means comprising a plurality of channels each of which is defined between the element and the support, each of the channels extending from the chamber and terminating short of an outer groove of the stationary base element, each channel having a shape and size such that the gas that is present in the chamber, as a result of inward flow of the gas, flows through the channels as a result of pressure in the chamber and causes the support to rotate as a result of fluid-dynamic drive characterized in that each of said channels has a depth that gradually reduces along its extent in a direction away from the said chamber.

* * * * *